United States Patent
Pfab

(10) Patent No.: US 6,952,762 B1
(45) Date of Patent: Oct. 4, 2005

(54) DATA STORAGE DEVICE WITH OVERLAPPED BUFFERING SCHEME

(75) Inventor: Stefan Pfab, Grosshesselohe (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/486,908

(22) PCT Filed: Jul. 1, 1999

(86) PCT No.: PCT/DE99/02009

§ 371 (c)(1),
(2), (4) Date: Mar. 3, 2000

(87) PCT Pub. No.: WO00/02127

PCT Pub. Date: Jan. 13, 2000

(30) Foreign Application Priority Data

Jul. 3, 1998 (DE) ............................. 198 29 836

(51) Int. Cl.[7] ............................................. G06F 12/00
(52) U.S. Cl. ........................ 711/220; 711/219; 711/154
(58) Field of Search .................. 711/201, 137, 202, 711/114, 154, 219, 220

(56) References Cited

U.S. PATENT DOCUMENTS 4,467,443 A   8/1984   Shima
5,307,321 A   4/1994   Sasai et al.

FOREIGN PATENT DOCUMENTS

EP           0 217 232 A1   4/1987
WO           WO 95/22791    8/1995

OTHER PUBLICATIONS

H.P. Messmer, "PC-Hardwarebuch" 5. Auflage, Addison-Wesley, (1997), pp. 55,56.
Intel, Microprocessor and Peripheral Handbook, vol. 1, Microprocessor (1988) p. 4-121.

*Primary Examiner*—Matthew D. Anderson
(74) *Attorney, Agent, or Firm*—Schiff Hardin LLP

(57) ABSTRACT

A data storage device is disclosed that, in response to a data output request, outputs stored data beginning with a selected output start address. The disclosed data storage device is characterized in that the selectable output start addresses exhibit such slight spacings from one another that the amount of data storable between neighboring output start addresses is smaller than the amount of data output in response to a data output request. As a result thereof, the plurality of accesses onto the data storage device can be reduced to a minimum.

16 Claims, 2 Drawing Sheets

DATA STORAGE DEVICE WITH OVERLAPPED BUFFERING SCHEME

Figure 1:
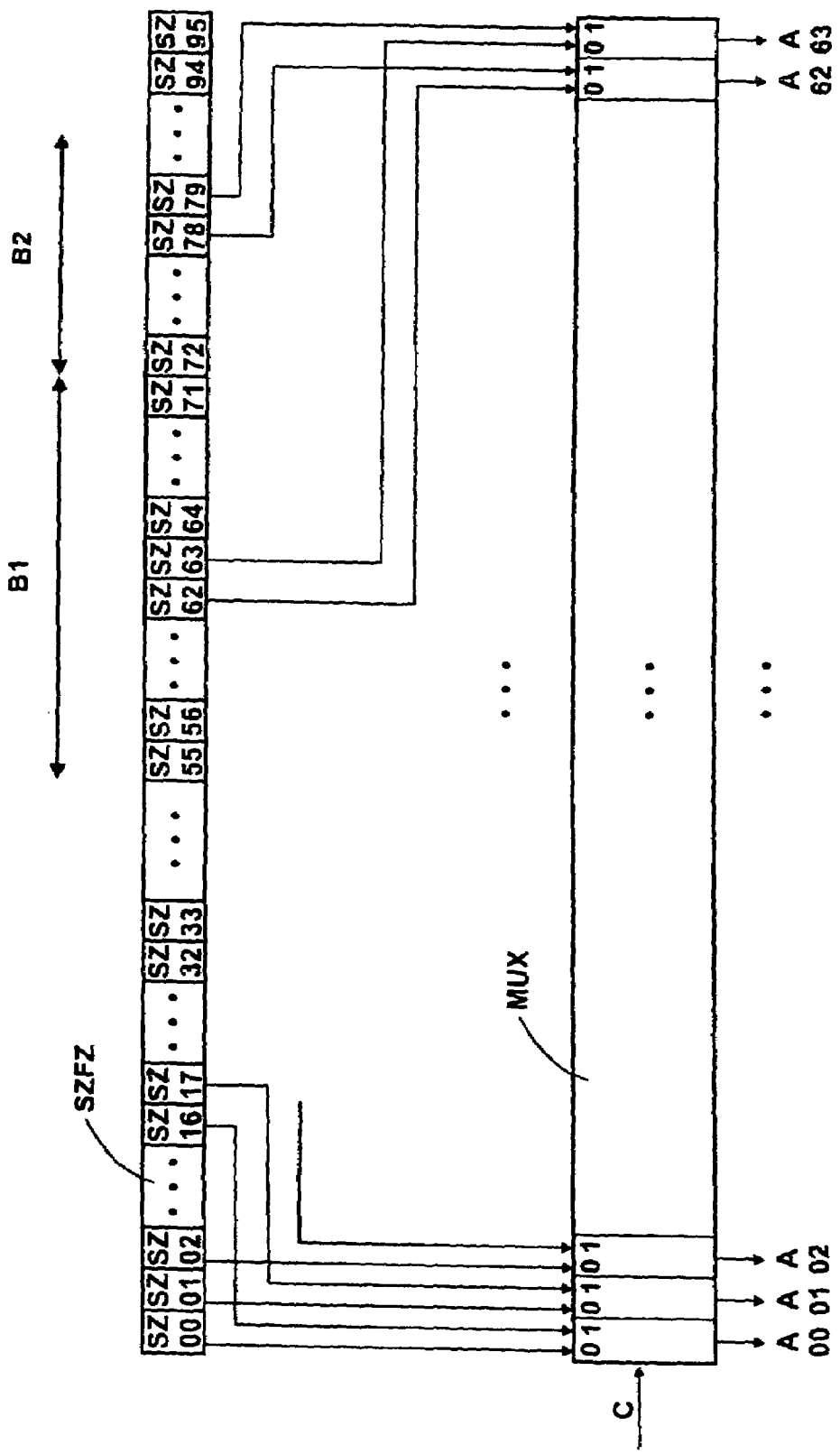

The present invention is directed to a device according to the preamble of patent claim 1, i.e. a data storage device that, in response to a data output request, outputs stored data from a selected output start address.

One of the most important properties that a data storage device must exhibit is comprised therein that data stored therein can be read out as quickly as possible. This is particularly true when the data storage device in a matter of a program memory for a program-controlled unit such as, for example, a microprocessor, microcontroller or the like. The data storage devices, which are usually employed as program memories (ROMs, EPROMs, Flash EPROMs, DRAMs, etc.) are usually not in the position to output the (command) data stored therein as fast as modern program-controlled units can process them. Fast, static RAMs are therefore often employed as buffer memories (Caches). These Caches make it possible that the program-controlled unit does not always have to retrieve the required data from the slow program memory but can often obtain them from the fast Cache.

As a result thereof, in particular, program sections having a linear execution (exhibiting no skips) can be implemented very fast. This, however, does not apply—or only applies in limited fashion—to program sections having commands such as, for example, branch commands and the like that interrupt the linear execution. In many instances, the command to be executed after a branch is not available in the Cache, for which reason the slow program memory must continue to be accessed in these cases as previously.

Added thereto as a complicating factor is that the command that is to be retrieved from the program memory after a branch or the like is often not completely contained in the data that are output by the program memory in response to a data output request. This can even be the case when the data set that is output in response to a data output request is relatively large (substantially greater than the command length) with, for example, 4 or 8 bytes. In such cases, two read accesses onto the program memory are required in order to be able to obtain the data representing the next command.

This is a not inconsiderable problem, particularly since approximately every third command in typical programs is a branch instruction.

The present invention is therefore based on the object of finding a measure with which the offering of data that represent successor commands after branches or the like can be speeded up.

This object is inventively achieved by the features claimed in the characterizing part of patent claim 1.

It is provided in the accord therewith that the selectable output start addresses exhibits such slight spacings from one another that the data set that can be stored between neighboring output start addresses is smaller than the data set output in response to a data output request.

Due to the slight mutual spacings of the selectable output start addresses, an output start address—leaving a few exceptions out of consideration—can always be applied with which the data representing a command can be read out from the program memory (the data storage device) on the basis of a single access.

As a result thereof, the time that is required in order to offer data representing successor commands after branches or the like can be reduced to a minimum in an astonishingly simple way.

The suitable selection of the output start address can thereby ensue, for example, upon employment of data referred to below as adaptation data that are applied to the data storage device in addition to the data that are otherwise standard and with which a determination is made as to whether and, potentially, to what extent the output start address to be employed is greater or smaller than the address that is defined by the address data likewise applied to the data storage device as output start address. As a result thereof, the output start address can be individually determined in dynamic fashion in an extremely simple way and given unmodified retention of the standard addressing of the data storage device.

Advantageous developments of the invention can be derived from the subclaims, the following description and from the Figures.

Figure 2:
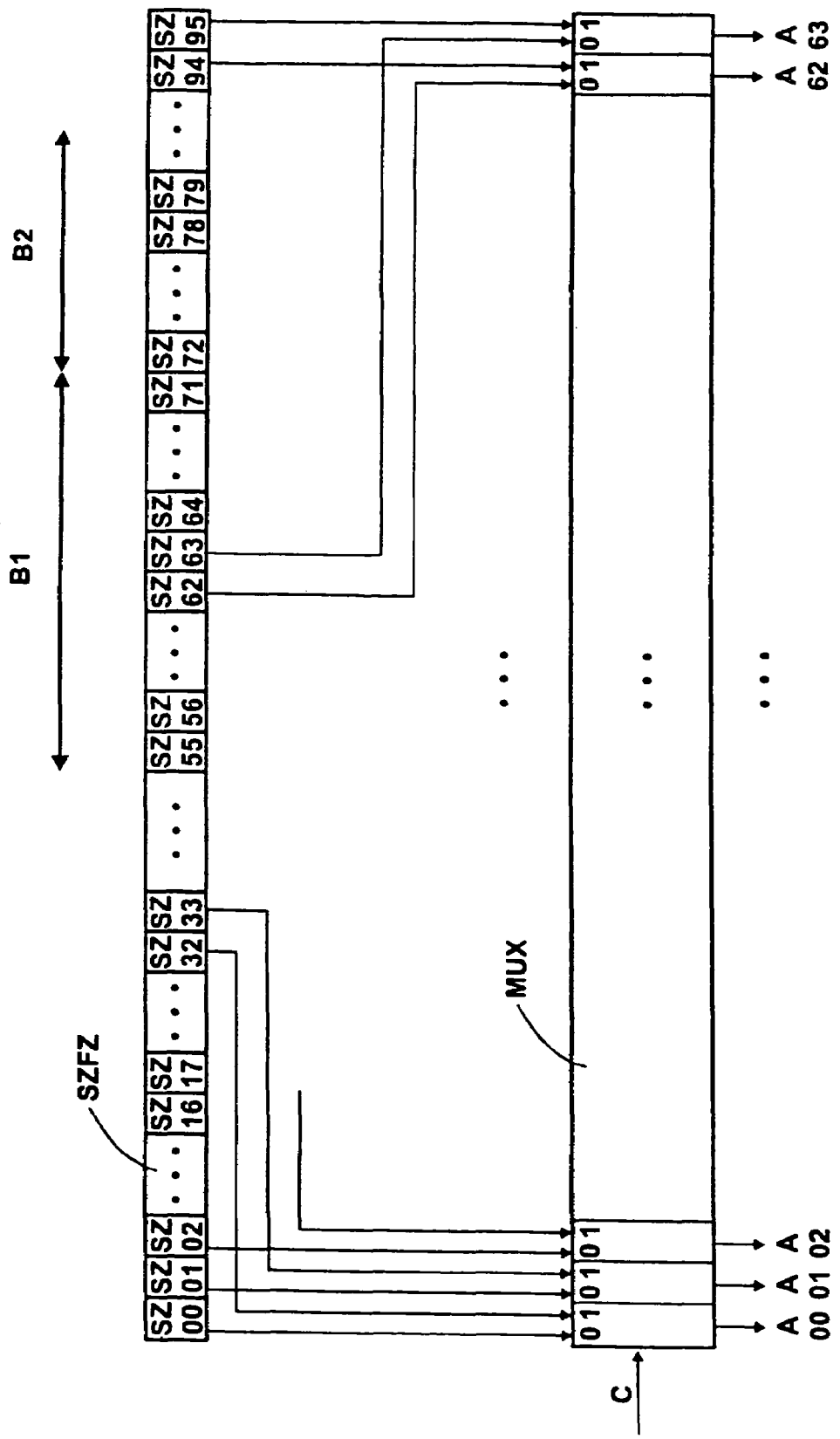

The invention is explained in greater detail below on the basis of exemplary embodiments with reference to the Figures. Shown are:

FIG. 1 the schematic structure of a first exemplary embodiment of the described data storage device; and FIG. 2 the schematic structure of second exemplary embodiment of the described data storage device.

The data storage devices described in greater detail below are semiconductor memories accommodated in an integrated circuit, RAMs, ROMs, EPROMs, flash-EPROMs or the like employed as program memories to be more precise; however, the data storage devices can also fundamentally be a matter of other, arbitrary data storage devices.

The data storage devices comprise a plurality of memory cells (designed for respectively storing one data bit) that are interconnected in a known way matrix-like to form a memory cell field comprising a plurality of rows and columns. It thereby proves especially advantageous in view of the access time when the individual memory cell field rows comprise a great number of memory cells. In the example under consideration, the memory cell field rows respectively contain 256 memory cells; of course, arbitrarily more or fewer memory cells can also be provided per memory cell field row.

Upon readout of data stored in the data storage device, a data word respectively comprising a predetermined data set is output. In the example under consideration, a data word covers 64 bits; of course, a data word can also comprise more or fewer bits.

The memory cells can be addressed via address data applied to the data storage device an adaptation data likewise applied to the data storage device. The addressing determines the memory cell from which data are written into the memory cell when writing the data storage device or, respectively, beginning with which memory cell data stored in the data storage device are output when reading the data storage device. The address of the memory cell beginning with which data stored therein are output when reading the data storage device is referred to below as output start address.

The following comments are limited to the readout of data from the data storage device. The readout of data from the data storage device is initiated by a data output request. In response to a data output request, 64 data bits (a 64-bit data word) are output from the output start address defined by the address data and the adaptation data.

The selectable output start addresses thereby exhibit such slight spacings from one another that the data set that can be stored between neighboring output start addresses is smaller then the data set output in response to a data output request.

The data storage device is addressed in the standard way by the address data applied to the data storage device. i.e., the output start addresses definable by the address data follow one another in steps that remain of constant size, whereby the step width corresponds exactly to the plurality of bits output in response to a data output request. In the case under consideration, wherein the data can be written and read in units of 64 bits, this means that the addresses of the bits numbers 0, 64, 128 and 192 of each and every memory cell field row can be defined as output start addresses via the address data.

The adaptation data applied to the data storage device defines whether and, potentially, to what extent the output start address to be employed is greater or smaller then the output start address defined by the address data. i.e., a definition can be made as to whether the output start address defined by the address data or an address that is more or less greater or smaller is employed as output start address.

This can be accomplished, for example, in that the interface between the memory cell field and the output terminals of the data storage device is correspondingly modified. Said interface has hitherto composed of one or more multiplexers, with which the bits

0 through x−1 x through 2x−1

..., or (n−1) x through nx−1 of the respectively selected memory cell field row are optionally through-connected onto the output terminals, whereby x represents equal to the plurality of bits per output data word and amounts to 64 in the example under consideration, and whereby n represents the plurality of data words storable per memory cell field row and amounts to 4 in the example under consideration.

What is achieved by one or more additional multiplexers and/or a modification of the existing multiplexers and (additional) drive thereof by the adaptation data is that the bits

0 through x−1 or y through x−1+y x through 2x−1 or x+y through 2x−1+y

..., or (n−1) x through nx−1 cr (n−1) x+y through nx−1 of the respectively selected memory field row are optionally through-connected onto the output terminals, whereby the new parameter y references an offset relative to the output start address defined by the address data.

The practical realization of an arrangement with which the bits 0 through 63 or the bits 16 through 79 of a memory cell field row are optionally through-connected onto the output terminals of the data storage device (offset y=16) is illustrated in FIG. 1.

The selected memory cell field row is thereby referenced with reference character SZFZ, the memory cells thereof are referenced with the reference characters SZ00, SZ01, SZ02, ..., the multiplexer is referenced with the reference character MUX and the control signal that controls the latter is referenced with the reference character C, whereby the control signal C driving the multiplexer MUX corresponds to the adaptation data or is based thereon.

When the control signal C of the multiplexer MUX has the value 0, then, as hitherto standard, the data stored in the memory cells SZ00 through SZ63 are through-connected onto the output terminals A00 through A63 of the data storage device; when, in contrast, the control signal C of the multiplexer MUX has the value 1, then the data stored in the memory cells SZ16 through SZ79 are through-connected onto the output terminals A00 through A63 of the data storage device.

In both instances, 64 data bits are output from the data storage device in response to a data output request. However, the origin of the data that are output differs because the output start address in the case of C=1 is greater by the offset (16 in this case) then the output start address in the case C=0.

The displaceability of the output start address as needed proves advantageous particularly when, due to the appertaining data output request, the command following a branch instruction or the like is to be read, and the data representing this command begin at a location that lies relatively far behind the data word normally output (without shifting the output start address). A command, namely, that could only be partially retrieved via a normal data output request can then be completely retrieved with a single access onto the data storage device.

This, for example, is the case when the memory cells SZ55 through SZ71 represent the first command B1 that is to be implemented following a branch or the like.

If one wished to retrieve the command B1 "normally", i.e. without shifting the output start address, two accesses would have to ensue onto the data storage device because only the first byte of the (2-byte) command B1 could be obtained by the first access. When, in contrast, the command B1 is retrieved with an output start address shifted by at least one byte, then the command B1 can be completely retrieved with a single access onto the data storage device.

The extent to which the output start address is shifted by the adaptation data is determined in the example under consideration by the wiring of the multiplexer MUX and can be arbitrarily determined in terms of operational sign and amount.

The practical realization of an arrangement with which the bits 0 through 63 or the bits 32 through 95 of a memory cell field row are optionally through-connected onto the output terminals of the data storage device (offset y=32) is shown in FIG. 2.

The structure of the arrangement according to FIG. 2 essentially corresponds to the structure of the arrangement according to FIG. 1; differences exist "only" in the wiring of the input terminals of the multiplexer MUX.

In the example under consideration, the shift of the output start address by 32 bits proves even more advantageous because the command B1 following the branch instruction and, further, the command B2 following thereupon and stored in memory cells SZ72 through SZ88 in the example under consideration can be completely obtained by a single access onto the data storage device.

This, however, does not mean that an offset of 32 is generally more advantageous than other offsets. Which offset is optimum particularly depends on the amount of data that is output per data output request and on the lengths of the commands to be carried out.

The data storage device can also be constructed such that the offset employed can be varied in terms of operational sign and/or amount, so that the offset can be individually selected dependent on the respectively current conditions (upon employment of adaptation data covering a plurality of bits).

When the offset, as in the exemplary embodiment illustrated in FIG. 2, is to be exactly half the size of the plurality of data bits output in response to a data output request, the adaptation data (respectively covering one bit in the examples illustrated in FIGS. 1 and 2) can be replaced by an additional (address) bit in the address data applied to the data storage device.

For the sake of completeness, let it be mentioned that it is compulsory for the proper functioning of the arrangements according to FIGS. 1 and 2 that more memory cells than there are data bits to be output must be read out when reading data out from the data storage device. Since, however, all memory cells of the selected memory cell field row are already usually read out given known data storage devices, no modifications or—at most—no more significant modifications of the data storage devices are required.

Let it also be pointed out that, when reading data stored at the start and/or at the end of a memory cell field row, it can occur that only a part of the data that are output is valid. Handling this particular characteristic, however, does not represent a problem. The fact that the data that are output are only partly valid can, for example, be signaled by a corresponding identifier (flag).

It should also be obvious that, in instances wherein the data representing a command proceed beyond the end of a memory cell field row (are continued in the next memory cell field row), two accesses onto the data storage device must still be carried out in order to completely retrieve the appertaining command.

Nonetheless, the plurality of accesses required in order to read specific data out can be reduced to a minimum by a data storage device constructed in the way described or similar thereto.

LIST OF REFERENCE CHARACTERS

SZFZ Memory cell field row
SZxx Memory cell xx within a memory cell field row
B1 First command that is to be carried out after a branch
B2 Second command that is to be carried out after a branch
MUX Multiplexer
C Multiplexer control signal (=adaptation data)
Ayy Output terminal yy of the data storage device

What is claimed is:

1. A data storage device in a single integrated circuit unit, comprising:
   memory cells having stored data with selectable output start addresses;
   said data storage device in a single integrated circuit unit comprising input and output terminals;
   wherein said storage device responds to a single data output request provided to said input of said single integrated circuit by outputting, via an internal through connection of said integrated circuit configured to adaptively connect bits of said memory cells to the output terminals, said stored data from said output terminals of said single integrated circuit beginning with a selected output start address that is one of said selectable output start addresses; and
   wherein said selectable output start addresses of said memory cells are spaced from one another such that an amount of data that can be stored between neighboring output start addresses is smaller than an amount of data output in response to said data output request.

2. A data storage device according to claim 1, wherein said selected output start address is determined utilizing address data applied to said input of said data storage device.

3. A data storage device according to claim 2, wherein: said selected output start address is determined by further utilizing adaptation data applied to said data storage device and;
said adaptation data is related both to said output start address to be employed and an address that is defined by said address data.

4. A data storage device according to claim 3, further comprising:
   a control mechanism of an interface at which said adaptation data are used to control said interface.

5. A data storage device according to claim 4, wherein said interface comprises a multiplexer that is driven based on the adaptation data.

6. A data storage device according to claim 4, wherein data stored with an output start address selected from the group consisting of a first output start address and a second output start address are through-connected.

7. A data storage device according to claim 6, wherein said first output start address is an address that is represented by said address data applied to said data storage device.

8. A data storage device, comprising:
   memory cells having stored data with selectable output start addresses;
   wherein said storage device responds to a data output request by outputting said stored data beginning with a selected output start address;
   wherein selectable output start addresses are spaced from one another such that an amount of data that can be stored between neighboring output start addresses is smaller than an amount of data output in response to said data output request;
   wherein said selected output start address is determined utilizing address data applied to said data storage device;
   wherein said selected output start address is determined by further utilizing adaptation data applied to said data storage device;
   wherein said adaptation data is related both to said output start address to be employed and an address that is defined by said address data;
   the data storage device further comprising:
   output terminals; and
   an interface provided between memory cells of said data storage device and said output terminals;
   wherein said adaptation data are used to control said interface;
   wherein data stored with an output start address selected from the group consisting of a first output start address and a second output start address are through-connected; and
   wherein said second output start address is related to, but different from, said first output start address by a scope defined by a wiring of a multiplexer.

9. A method for outputting data from a data storage device in a single integrated circuit unit, comprising the steps of:
   receiving a single data output request by said data storage device provided to said input of said single integrated circuit; and
   outputting stored data, via an internal through connection of said integrated circuit configured to adaptively connect bits of the memory cells to said output terminals, from said output terminals of said single integrated circuit, in a quantity of data that is greater than a quantity of data that can be stored between neighboring output start addresses of said memory cells, and beginning said outputting of stored data with a selected output start address which is one of said output start addresses.

10. The method according to claim 9, further comprises the steps of:

applying address data to said data storage device; and determining said selected output start address by utilizing said address data.

11. The method according to claim 10, further comprising the step of:

defining adaption data as an indicia related to said address data and said output start address;

applying said adaption data to said data storage device, wherein said step of determining said selected output start address utilizes said adaption data.

12. The method according to claim 11, further comprising the step of:

controlling, with said adaption data, said internal through connection provided between memory cells of said data storage device and said output terminals of said data storage device.

13. The method according to claim 12, further comprising the steps of:

controlling a multiplexer contained within said interface by applying said adaption data; and through-connecting, via said multiplexer, data stored within said data storage device beginning with an address selected from the group consisting of a first output start address and a second output start address.

14. The method according to claim 13, further comprising the step of calculating said first output start address from said address data applied to said data storage device.

15. A method for outputting data from a data storage device, comprising the steps of:

receiving a data output request by said data storage device;

outputting stored data in a quantity of data that is greater than a quantity of data that can be stored between neighboring output start addresses, and beginning said outputting of stored data with a selected output start address which is one of said output start addresses;

applying address data to said data storage device;

determining said selected output start address by utilizing said address data;

defining adaption data as an indicia related to said address data and said output start address;

applying said adaption data to said data storage device, wherein said step of determining said selected output start address utilizes said adaption data;

controlling, with said adaption data, an interface provided between memory cells of said data storage device and output terminals of said data storage device;

controlling a multiplexer contained within said interface by applying said adaption data;

through-connecting, via said multiplexer, data stored within said data storage device beginning with an address selected from the group consisting of a first output start address and a second output start address; and wiring said multiplexer so that said second output start address is related to, but different from, said first output start address by a scope defined by said wiring.

16. A data storage device in a single integrated circuit unit, comprising:

memory cells having stored data with selectable output start addresses;

said data storage device in a single integrated circuit unit comprising input and output terminals;

wherein said storage device responds to a single data output request provided to said input of said single integrated circuit by outputting, via an internal through connection of said integrated circuit, said stored data from said output terminals of said single integrated circuit beginning with a selected output start address that is one of said selectable output start addresses; and wherein selectable output start addresses are spaced from one another such that an amount of data that can be stored between neighboring output start addresses is smaller than an amount of data output in response to said data output request; and wherein the device is selected from the group consisting of a RAM, a ROM, EPROM and flash EPROM.

\* \* \* \* \*